United States Patent [19]
Moriya

[11] Patent Number: 5,661,320
[45] Date of Patent: Aug. 26, 1997

[54] SEMICONDUCTOR DEVICE AND METHOD OF MANUFACTURING THE SAME

[75] Inventor: Hiroyuki Moriya, Kanagawa, Japan

[73] Assignee: Sony Corporation, Tokyo, Japan

[21] Appl. No.: 475,763

[22] Filed: Jun. 7, 1995

Related U.S. Application Data

[62] Division of Ser. No. 285,722, Aug. 4, 1994, Pat. No. 5,506,163.

[30] Foreign Application Priority Data

Aug. 9, 1993 [JP] Japan .................................. 5-197423

[51] Int. Cl.$^6$ .......................... H01L 27/108; H01L 29/76; H01L 29/94; H01L 31/119
[52] U.S. Cl. ..................... 257/296; 257/304; 257/301
[58] Field of Search ................................. 257/296, 304, 257/301, 309, 310

[56] References Cited

U.S. PATENT DOCUMENTS

| | | |
|---|---|---|
| 4,549,926 | 10/1985 | Corboy, Jr. et al. . |
| 4,907,047 | 3/1990 | Kato et al. ............................. 257/304 |
| 4,926,233 | 5/1990 | Hutter ..................................... 257/510 |
| 4,971,925 | 11/1990 | Alexander et al. . |
| 5,091,330 | 2/1992 | Cambou et al. . |
| 5,102,819 | 4/1992 | Matsushita et al. . |
| 5,183,783 | 2/1993 | Ohta et al. . |
| 5,555,520 | 9/1996 | Sudo et al. ............................. 257/304 |

*Primary Examiner*—Stephen Meier
*Attorney, Agent, or Firm*—Hill, Steadman & Simpson

[57] ABSTRACT

In method of manufacturing a DRAM by using a laminate SOI technique, which makes it possible to form a thin semiconductor film of a uniform thickness, the method includes steps of forming a step portion on a major surface of a silicon substrate, forming an insulating film on the major surface of the silicon substrate, forming a capacitor which is connected to the step portion through a contact hole formed through the insulating film on the step portion, grinding the silicon substrate from the other major surface thereof after a support substrate is laminated onto the silicon substrate to remain the step portion, forming a thin silicon film on the insulating film by lateral epitaxial growth process based on the silicon of the remaining step portion serving as a seed for the lateral epitaxial growth, and forming a MOS transistor in the thin silicon film.

4 Claims, 13 Drawing Sheets

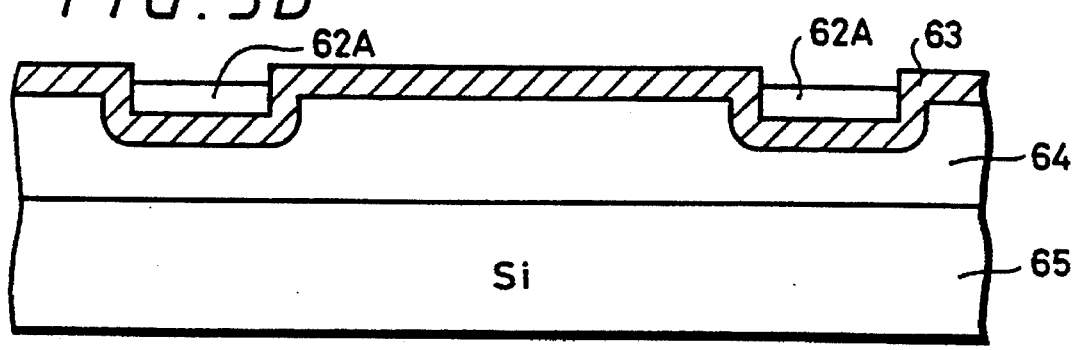
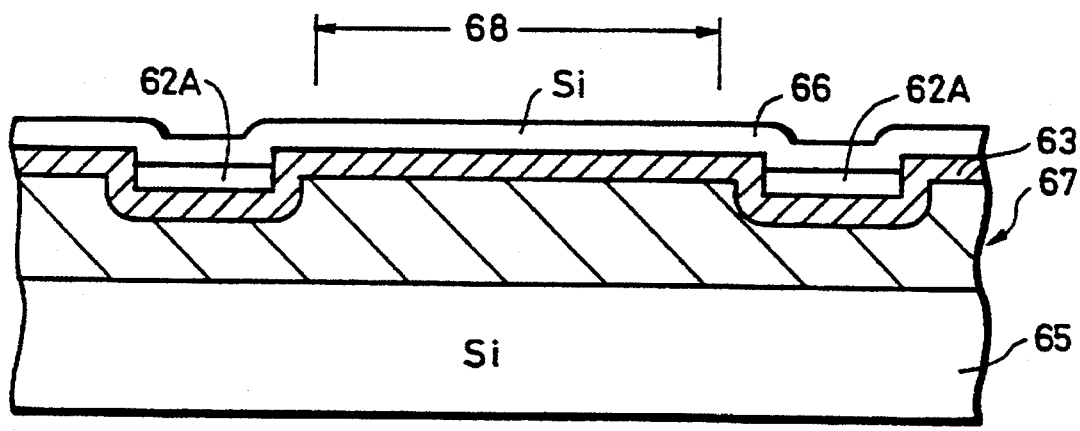

5,661,320

1

SEMICONDUCTOR DEVICE AND METHOD OF MANUFACTURING THE SAME

This is a division of application Ser. No. 08/285,722, filed Aug. 4, 1994 now U.S. Pat. No. 5,506,163.

BACKGROUND OF THE INVENTION

1. Field of the Invention

The present invention relates to a semiconductor device such as a semiconductor memory or the like and a method of manufacturing such a semiconductor device.

2. Description of the Related Art

Conventionally, a semiconductor memory, in particular, a dynamic random access memory (DRAM), has been manufactured by using laminate SOI (semiconductor on insulator) technique. FIGS. 1A to 1L show an example of manufacturing methods of the DRAM.

First, as shown in FIG. 1A, a photoresist layer 2 is formed selectively on a portion of a major surface of a silicon substrate 1 on which a switching MOS (metal-oxide semiconductor) transistor is to be formed later. Using this photoresist layer 2 as a mask, the other portion 3 of the silicon substrate 1 which corresponds to a device isolation region is etched away to a predetermined depth C (for example, about 80 to 100 nm), thereby forming a step or convex portion 4 with a height of about 80 to 100 nm on the principal surface of the substrate 1.

Next, as shown in FIG. 1B, the photoresist layer 2 is removed and an insulating film 5 such as an $SiO_2$ film or the like is formed over the entire surface of the substrate 1. Then, the insulating film 5 is partially removed by patterning process by using a photoresist layer 6 as a mask. That is, a boundary portion 7 of the insulating film 5 which extends over the convex portion 4 of the principal surface of the substrate 1 and the other concave portion 3 is selectively etched away to thereby expose the substrate 1 at the boundary portion 7.

Next, as shown in FIG. 1C, after the photoresist layer 6 is removed, a first polycrystalline silicon film 8 is formed over the entire surface of the substrate 1 including the insulating film 5 so as to bury the boundary portion 7, and an insulating film 9 such as an $SiO_2$ film or the like is further formed on the silicon film 8.

Then, the insulating film 9 and the polycrystalline silicon film 8 are partially removed by patterning process by using a photoresist layer (not illustrated) as a mask, so that as shown in FIG. 1D, a columnar portion 10 composed of the polycrystalline silicon film 8 and the insulating film 9 is formed so as to correspond to the shape of a capacitor which will be formed later at the position corresponding to the boundary portion 7.

Next, as shown in FIG. 1E, after a second polycrystalline silicon film 11 is formed over the entire surface of the insulating film 5 and the columnar portion 10, the second polycrystalline silicon film 11 is partially removed by anisotropic etching process, thereby forming side walls 11A made of the polycrystalline silicon 11 on the flanks of the columnar portion 10 as shown in FIG. 1F.

Next, as shown in FIG. 1G, only the insulating film 9 of the columnar portion 10 is selectively etched away by using a photoresist layer 12 as a mask. As a result, a capacitor electrode 24 is constituted by the first polycrystalline silicon film 8 connected to the substrate 1 and the second polycrystalline silicon film side wall 11A.

Next, as shown in FIG. 1H, a dielectric film 13 is formed by deposition on the surface of the capacitor electrode 24.

2

Next, as shown in FIG. 1I, a third polycrystalline silicon film 14 constituting an opposite or counter electrode is thickly formed so as to bury the capacitor electrode 24. Subsequently, the counter electrode 14 constituted by the polycrystalline silicon film is levelled by grinding to the position indicated by a one-dot-chain line 15.

Then, as shown in FIG. 1J, another silicon substrate 15 which constitutes a support substrate is laminated onto the levelled surface of the counter electrode 14.

Next, as shown in FIG. 1K, the silicon substrate 1 is ground from the rear surface or the other major surface thereof to such a level that the convex portion 4 is remained and the insulating film 5 at the device isolation region is exposed. Thus, a thin silicon film 16 of about 80 to 100 nm thickness is formed by the convex portion 4 on the level.

Next, as shown in FIG. 1L, a word line 19 serving as a gate electrode is formed on the thin silicon film 16 through a gate insulating film 18. Impurity is diffused in the thin silicon film 16 by using the word line 19 as a mask to thereby form diffusion regions 20, 21 and 22 constituting a source and a drain in the thin silicon film 16 so that a switching MOS transistor 23 is formed therein. A capacitor 25 is composed from the capacitor electrode 24, the dielectric film 13, and the counter electrode 14 made of the third polycrystalline silicon in which the capacitor 25 is connected to the diffusion regions 21 and 22.

As shown in FIG. 1L, after an insulating film 26 is formed, a contact hole 27 is formed and then a bit line 28 is formed so as to be connected to the diffusion region 20. As a consequence, a desired DRAM cell 29 is obtained which is constituted by the capacitor 25 for storing electric charges and the switching MOS transistor 23 for controlling the transferring and draining electric charges to and from the capacitor 25.

In such a conventional manufacturing method as mentioned above, however, it is difficult to leave the thin silicon film 16 in the grinding step of FIG. 1K. As mentioned above, the thickness of this thin silicon film 16 is about 100 nm. Consequently, in view of grinding irregularities, warpage of the semiconductor wafer, and unevenness in the thickness of the semiconductor wafer or the like, it is difficult to control the thickness of the thin silicon film 16 on the wafer surface. For example, if the grinding is carried out excessively in order to eliminate the irregularities of the thickness, the thin silicon film 16 will disappear.

Due to the fact that the thickness of the thin silicon film 16 is being further thinned to several tens of nm in accordance with improvements in the degree of integration, it is becoming increasingly difficult to leave the thin silicon film 16 by grinding it from the rear surface of the silicon substrate 1.

OBJECTS AND SUMMARY OF THE INVENTION

It is an object of the present invention to provide an improved semiconductor device manufacturing method in which the aforementioned shortcomings and disadvantages encountered with the related art can be eliminated.

More specifically, it is an object of the present invention to provide a semiconductor device manufacturing method which is able to form a thin semiconductor film of a uniform film thickness required for fabricating an element of the device.

As an aspect of the present invention, there is provided a method of manufacturing a semiconductor device which includes steps of forming a step portion on a major surface of a semiconductor substrate, forming an insulating film on the major surface of the semiconductor substrate, grinding the semiconductor substrate from the other major surface thereof after a support substrate is laminated onto the semiconductor substrate so that the semiconductor substrate is eliminated while remaining only the step portion, and forming a thin semiconductor film on the insulating film by lateral epitaxial growth process based on the semiconductor of the remaining step portion as a seed for the lateral epitaxial growth.

As another aspect of the present invention, there is provided a method of manufacturing a semiconductor device which includes steps of forming a step portion on a major surface of a semiconductor substrate, and forming an insulating film on the major surface, forming a capacitor so that the capacitor is connected to the step portion through a contact hole formed in the insulating film at a position above the step portion, grinding the semiconductor substrate from the other major surface thereof after a support substrate is laminated onto the semiconductor substrate so that semiconductor substrate is eliminated while remaining only the step portion, forming a thin semiconductor film on the insulating film by lateral epitaxial growth process based on the semiconductor of the remaining step portion serving as a seed of the lateral epitaxial growth, and forming a transistor in the thin semiconductor film.

According to the first aspect of the present invention, after the support substrate has been affixed by lamination, the semiconductor substrate is ground from the other major surface (that is, the rear surface) thereof while remaining only the step portion which has been formed in advance on the major surface of the semiconductor substrate. Then, the thin semiconductor film is formed on the insulating film facing on the ground surface by lateral epitaxial growth process based on the semiconductor of the step portion serving as a seed of the lateral epitaxial growth, whereby the thin semiconductor film of a uniform film thickness is formed regardless of warpage of the semiconductor substrate, thickness irregularities thereof, or grinding irregularities. Thereafter, a desired semiconductor element is formed on this thin semiconductor film.

The remaining step portion left as a result of the grinding process is used as a seed at the time of the lateral epitaxial growth process, and hence there is no need to strictly control the thickness of the step portion. In this case, the step portion on the major surface of the semiconductor substrate is merely required to be thick in advance so that the grinding irregularities are absorbed by the step portion.

Accordingly, the yield of the grinding process is improved, and a highly reliable semiconductor device can be manufactured with good yield.

According to the second aspect of invention, the capacitor is formed so as to be connected to the step portion through the contact hole of the insulating film on the top of the step portion of the semiconductor substrate. Then, after the support substrate has been affixed by laminating, the other major surface of the semiconductor substrate is ground while remaining the step portion, and the thin semiconductor film is formed on the insulating film through lateral epitaxial growth process based on the semiconductor of the remaining step portion serving as a seed of the lateral epitaxial growth process. Accordingly, a thin semiconductor film of a uniform thickness can be formed regardless of warpage of the semiconductor substrate, thickness irregularities thereof, or grinding irregularities. By forming a switching transistor on this thin semiconductor film, it is possible to manufacture a semiconductor memory, in particular, a cell of a DRAM, with good yield.

The preceding and other objects, features, and advantages of the present invention will become apparent from the following detailed description of illustrative embodiments thereof when read in conjunction with the accompanying drawings.

BRIEF DESCRIPTION OF THE DRAWINGS

FIGS. 3A to 3E shows schematic sectional process views to show a DRAM device and used for explaining a method of manufacturing the DRAM device by using the laminate SOI technique according to a second embodiment of the present invention.

DESCRIPTION OF THE PREFERRED EMBODIMENTS

The semiconductor device and the manufacturing method thereof according to the embodiments of the present invention will now be described with reference to FIGS. 2A to 2O and FIGS. 3A to 3E, in which case, the present invention is applied to a DRAM.

The first embodiment of the present invention will be explained with reference to FIGS. 2A to 2O.

Figure 1A:
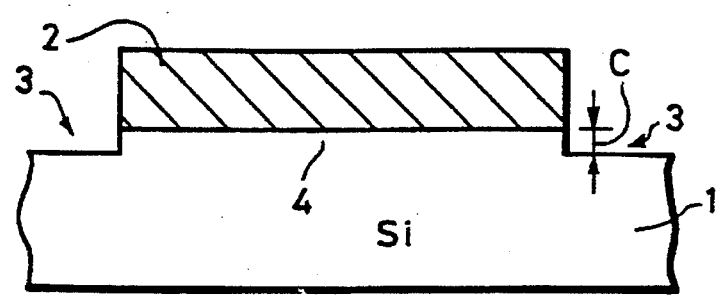
FIGS. 1A to 1L show schematic sectional process views used for explaining the related art method of manufacturing the DRAM by using a laminate SOI technique.
Figure 1B:
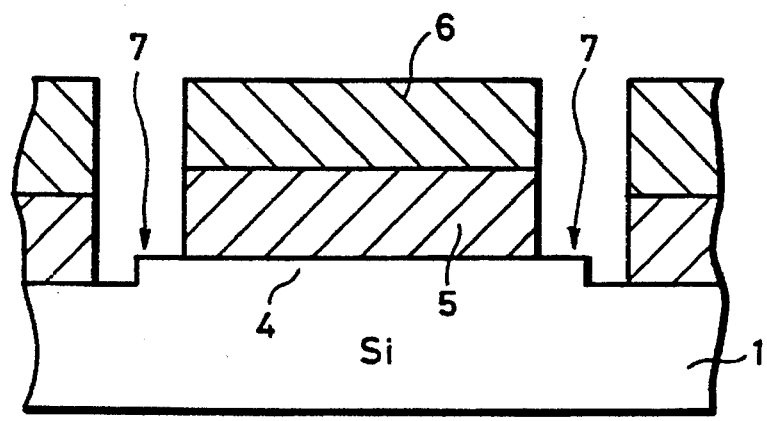
Figure 1C:
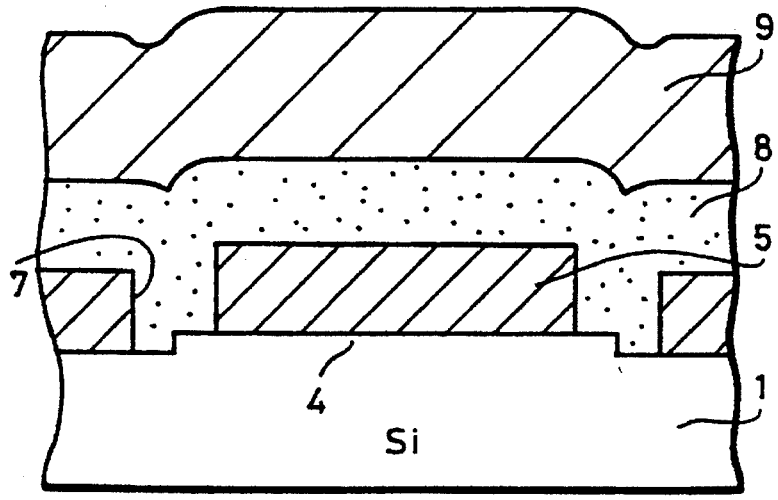
Figure 1D:
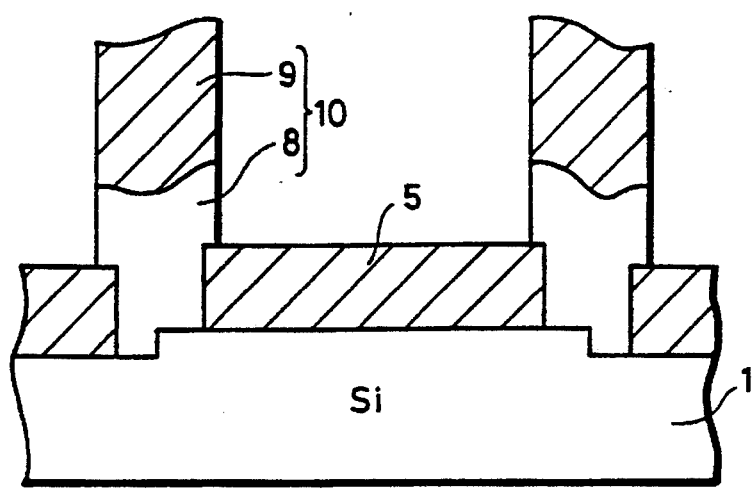
Figure 1E:
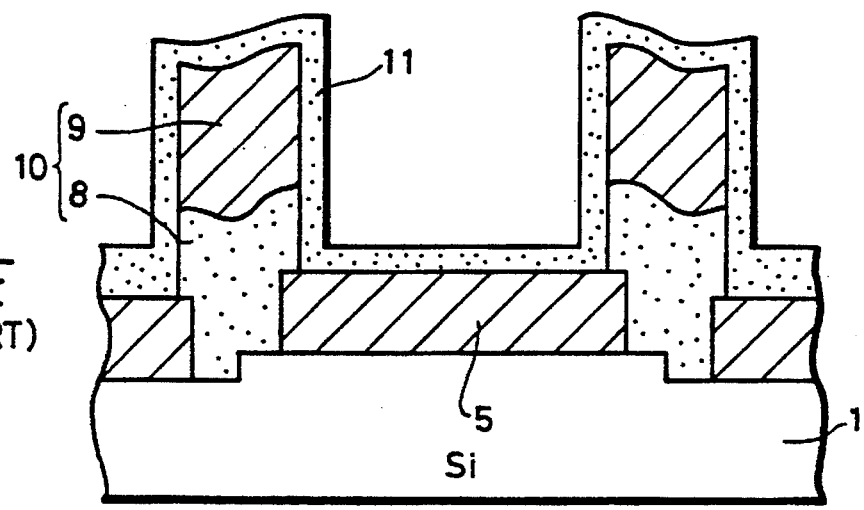
Figure 1F:
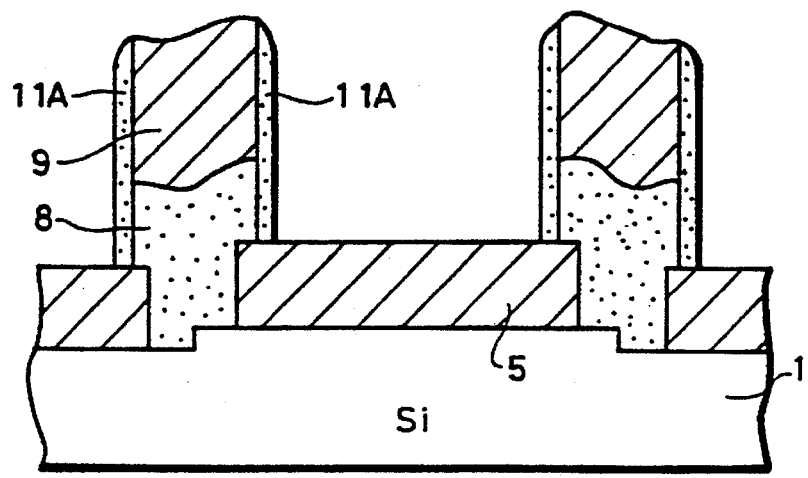
Figure 1G:
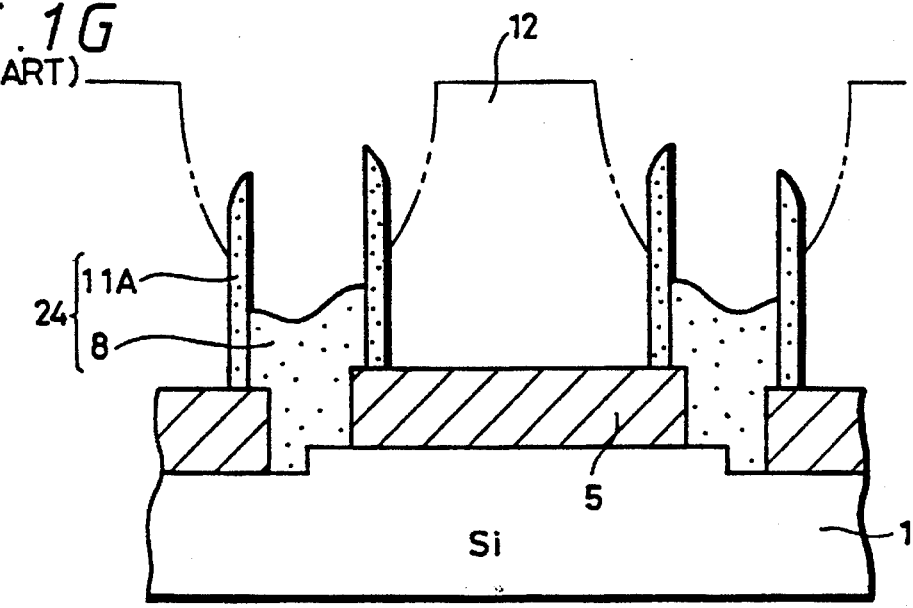
Figure 1H:
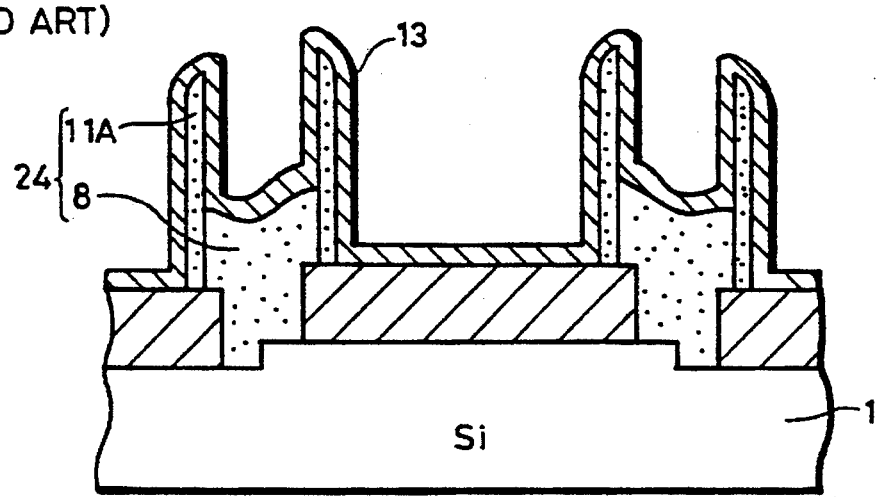
Figure 1I:
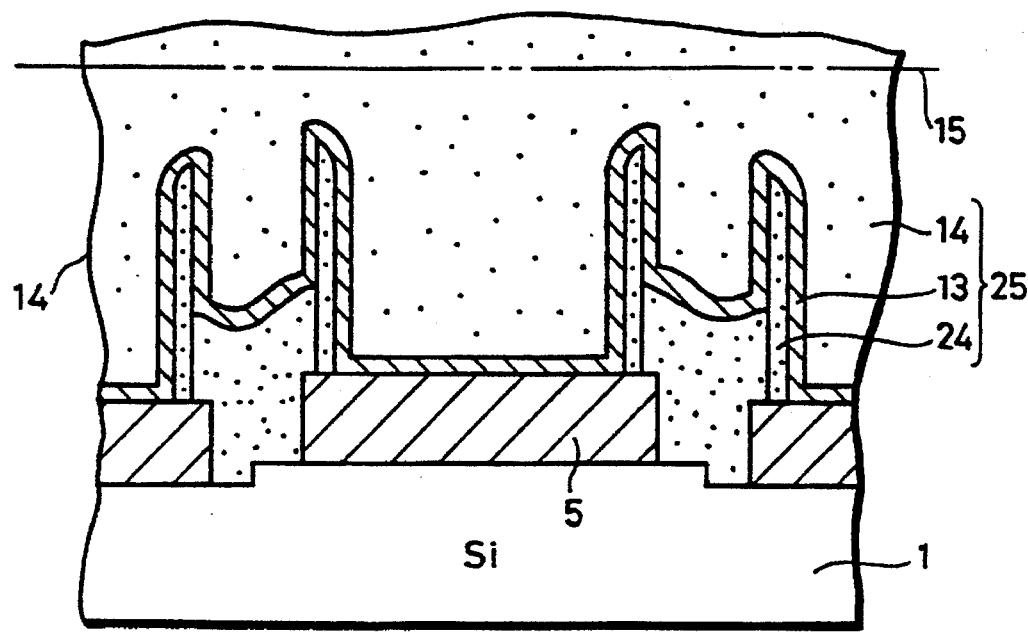
Figure 1J:
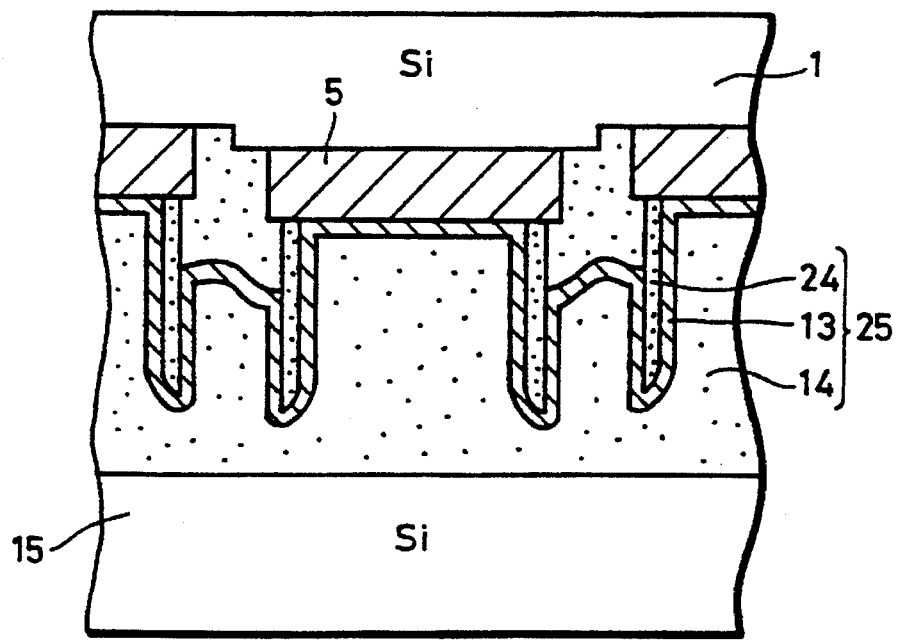
Figure 1K:
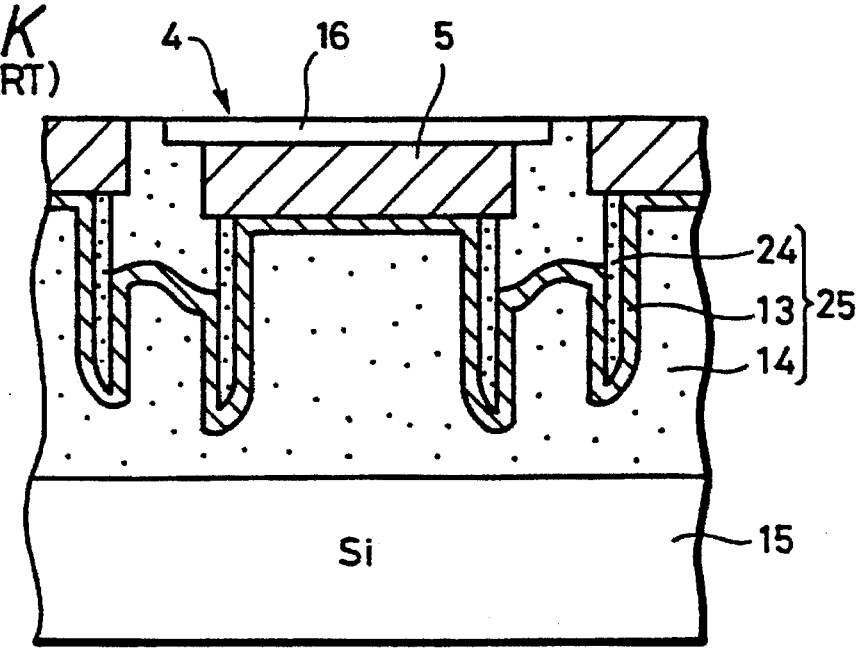
Figure 1L:
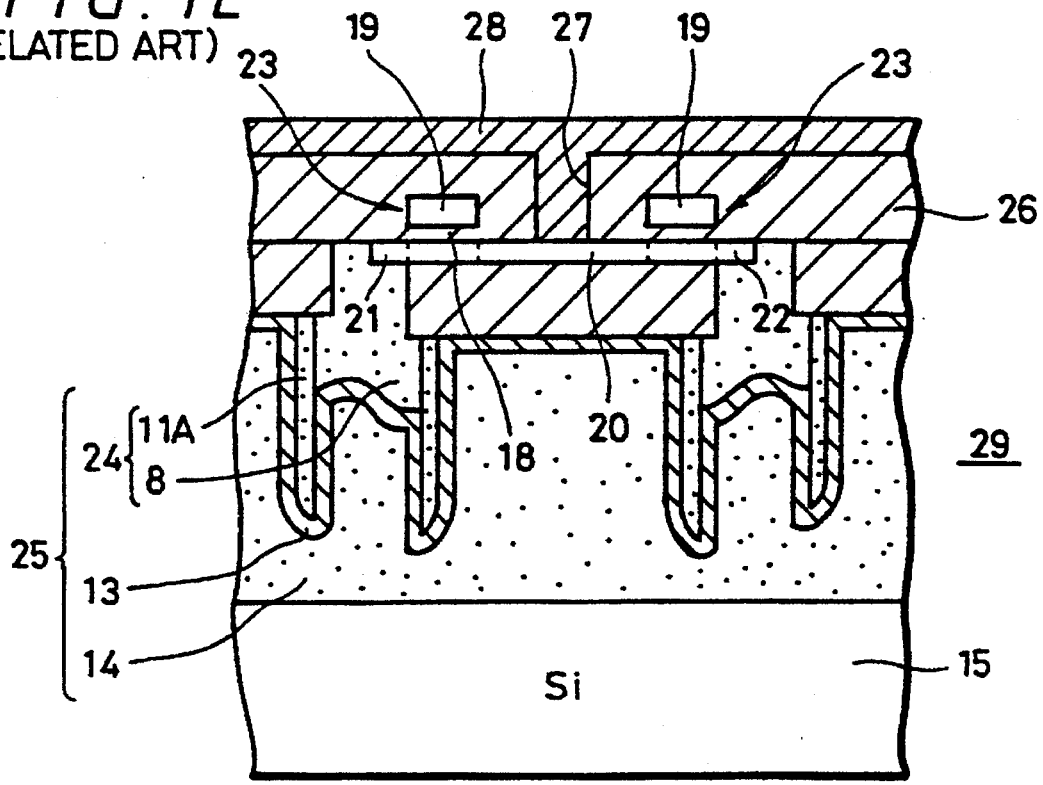
Figure 2A:
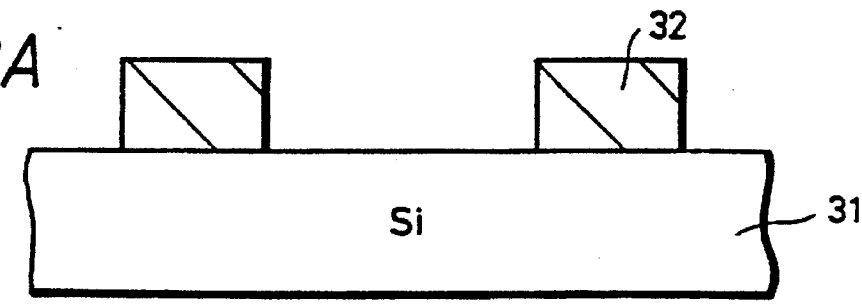
FIGS. 2A to 2O shows schematic sectional process views to show a DRAM device and used for explaining a method of manufacturing the DRAM device by using the laminate SOI technique according to a first embodiment of the present invention.

First, as shown in FIG. 2A, a photoresist layer 32 is selectively formed on a part of a major surface of a silicon substrate 31 which part is to be connected to a capacitor of a switching MOS transistor which will be formed later.

Figure 2B:
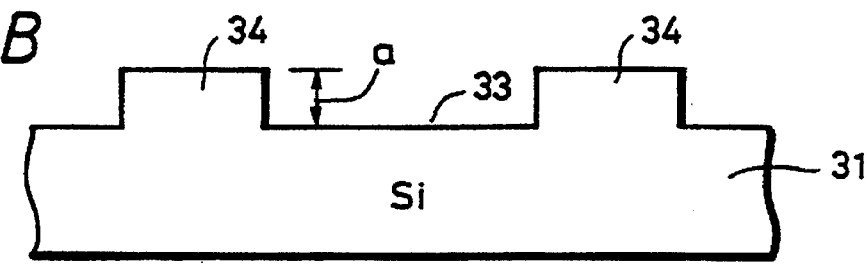

Using this photoresist layer 32 as a mask, as shown in FIG. 2B, the other portion 33 of the major surface of the silicon substrate 31 is etched away to a predetermined depth a, thereby forming a step or convex portion 34 on the major surface of the silicon substrate 31.

The depth a is set to a depth, for example, several hundreds nm, so that the convex portion 34 can remain after a grinding process described later on the major surface of the substrate 31.

Figure 2C:
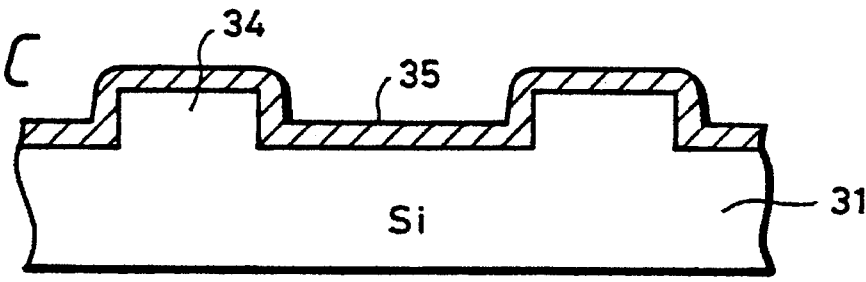

Next, as shown in FIG. 2C, an insulating film 35 made of such as a $SiO_2$ or the like is formed, by CVD (chemical vapor development) process over the entire surface of the major surface of the substrate 31 including the convex portion 34.

Figure 2D:
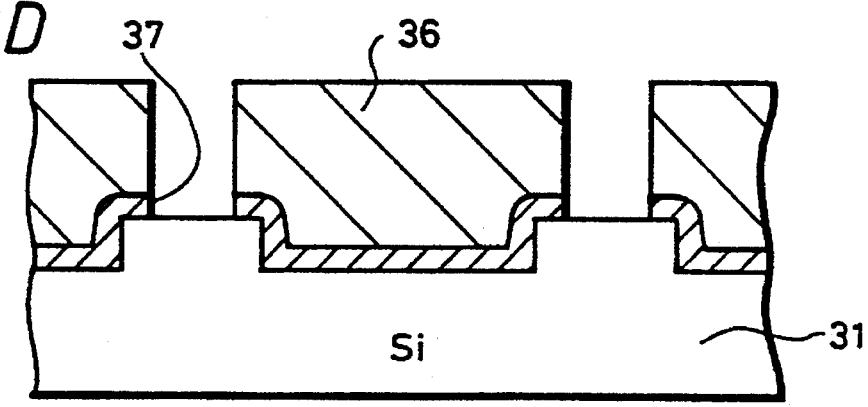

Next, as shown in FIG. 2D, using a photoresist layer 36 as a mask, the insulating film 35 on the top of the convex portion 34 is selectively removed by patterning process so as to form a contact hole 37.

Figure 2E:
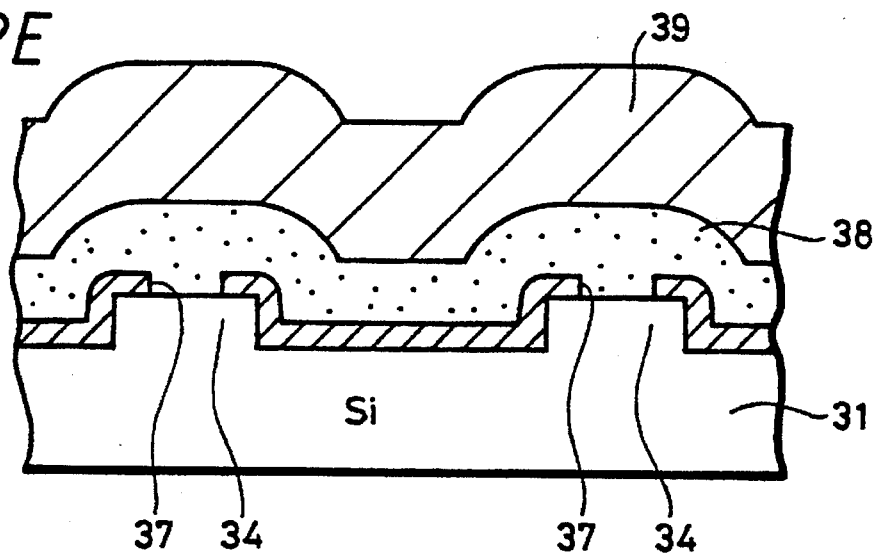

Then, as shown in FIG. 2E, the photoresist layer 36 is removed, and a polycrystalline silicon film 38 is formed on the entire surface of the insulating film 35 and the convex portion 34 by the CVD process or the like so that the polycrystalline silicon film 38 is connected to the convex portions 34 of the silicon substrate 31 which faces on the contact hole 37. Then, an insulating film 39 made of such as $SiO_2$ or the like is formed on the top of the insulating film 38 to cover the entire surface thereof by the CVD process or the like.

Figure 2F:
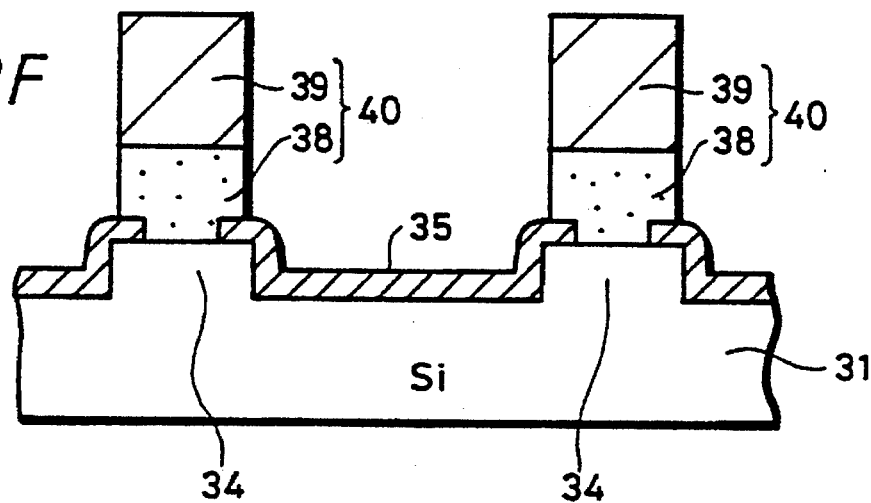

Next, as shown in FIG. 2F, the insulating film 39 and the polycrystalline silicon film 38 are selectively removed by patterning process so that a columnar portion 40 constituted by the insulating film 39 and the polycrystalline silicon film 38 is formed at a position corresponding to the convex portion 34 so as to correspond to the shape of a capacitor which will be formed later.

Figure 2G:
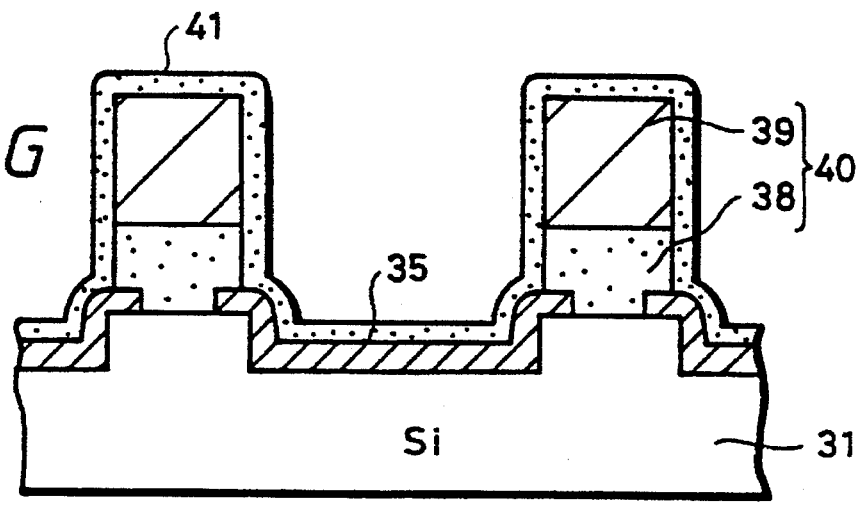
Figure 2H:
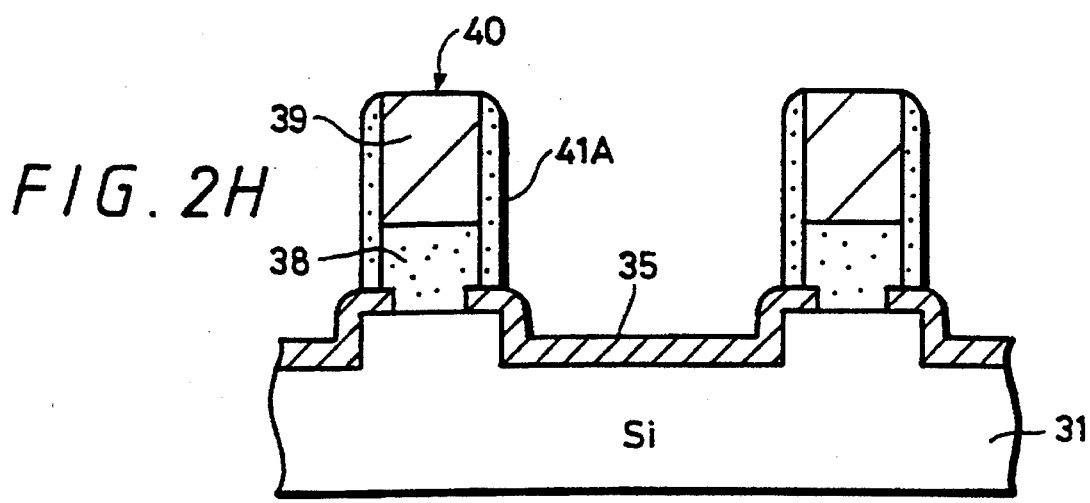

Next, as shown in FIG. 2G, a polycrystalline silicon film 41 is formed by deposition over the entire surface of the columnar portion 40 and the insulating film 35. Then, as shown in FIG. 2H, the polycrystalline silicon film 41 is selectively removed by anisotropic etching process, thereby forming side walls 41A of the polycrystalline silicon along the flanks of the columnar portion 40.

Figure 2I:
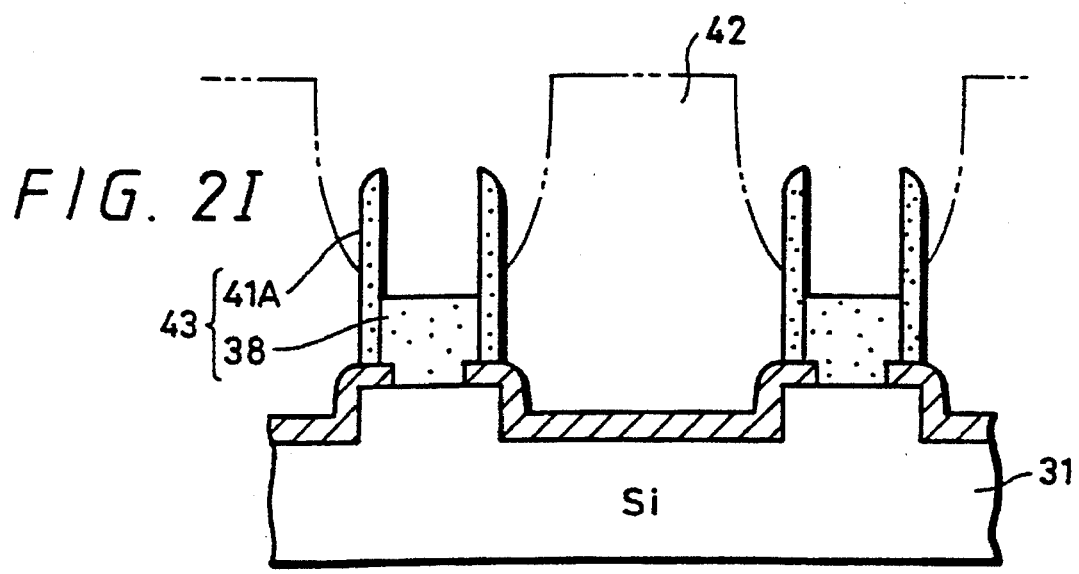

Next, as shown in FIG. 2I, using a photoresist layer 42 as a mask, only the insulating film 39 of the columnar portion 40 is selectively etched away.

As a result, a capacitor electrode 43 composed of the first polycrystalline silicon film 38 connected to the convex portion 34 of the silicon substrate 31, and the side walls 41A of polycrystalline silicon connected to the film 38 is formed.

Figure 2J:
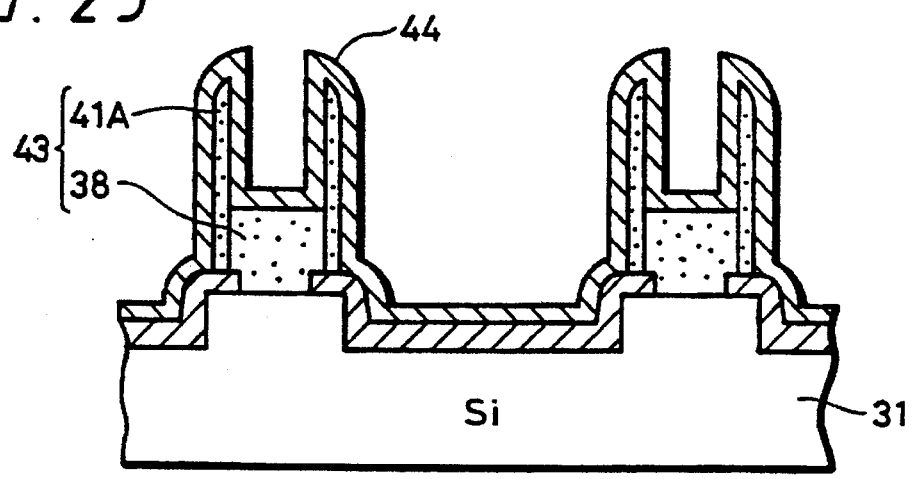

Next, as shown in FIG. 2J, a dielectric film 44 is formed by deposition on the surface of the capacitor electrode 43.

Figure 2K:
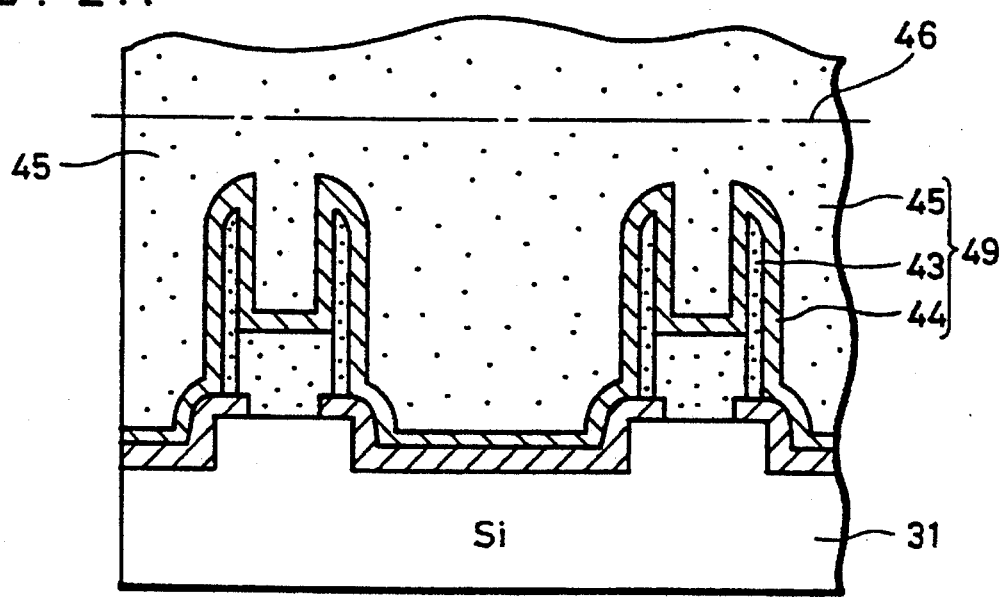

Next, as shown in FIG. 2K, a polycrystalline silicon film 45 which constitutes an opposite or counter electrode is thickly formed on the dielectric film 44 so as to bury the capacitor electrode 43 therein.

Subsequently, the counter electrode 45 constituted by the polycrystalline silicon film is levelled by grinding to the position indicated by a one-dot-chain line 46, so that a capacitor 49 is composed of the capacitor electrode 43, the dielectric film 44, and the counter electrode 45.

Figure 2L:
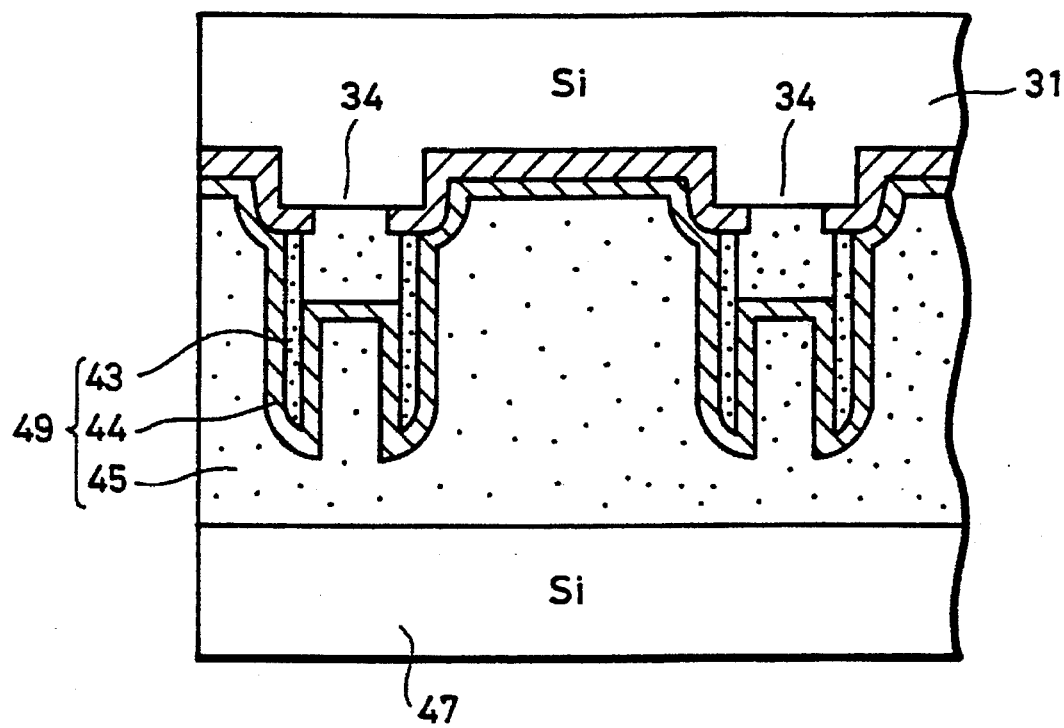

Then, as shown in FIG. 2L, another silicon substrate 47 which will constitute a support substrate is laminated to the leveled or ground surface of the counter electrode 45.

Figure 2M:
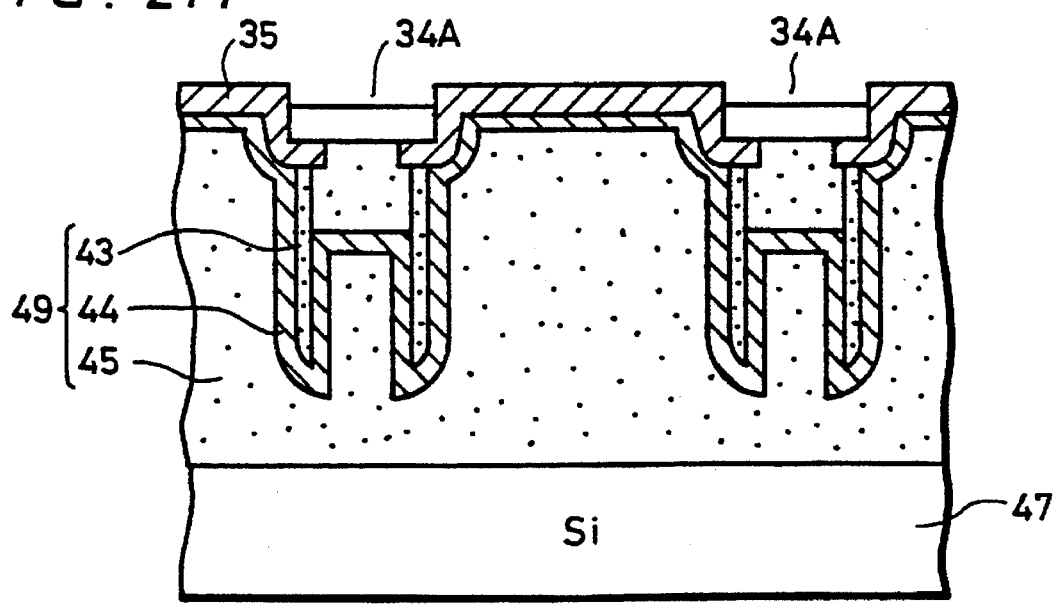

Next, as shown in FIG. 2M, the silicon substrate 31 is ground from the rear surface or the other major surface thereof to such a level that the silicon substrate 31 is entirely ground while remaining only a portion 34A as shown in the drawing corresponding to the convex portion 34 of the silicon substrate 31, to thereby expose the insulating film 35.

Due to grinding irregularities, the thickness of the remaining silicon portion 34A is very uneven within the silicon wafer surface. The unevenness, however, can be absorbed by setting the depth a of the convex portion 34 larger in advance.

Figure 2N:
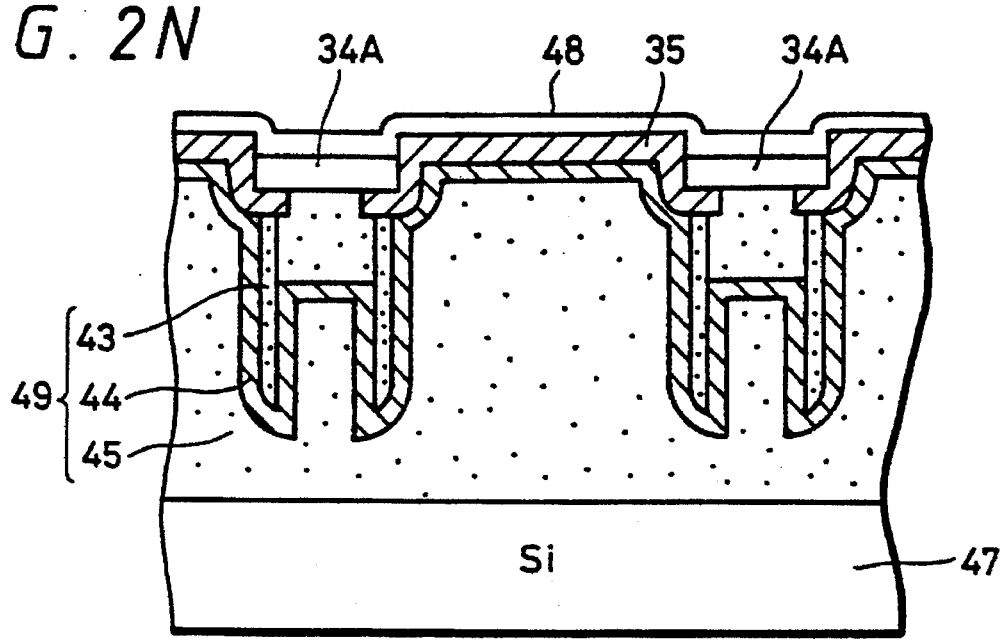

Next, as shown in FIG. 2N, a thin silicon film 48 is formed on the insulating film 35 and the silicon portion 34A by lateral epitaxial growth process based on the remaining silicon portion 34A serving as a seed of the lateral epitaxial growth. This lateral epitaxial growth can be performed, for example, by supplying 0.06% SiH$_4$ at 1100° C. in hydrogen (H$_2$). With regard to the lateral epitaxial growth, the silicon grows mainly in the lateral (horizontal) direction such that a ratio of growth between vertical and horizontal directions is approximately 1:9, so that the thin silicon film 48 is formed on the insulating film 35 with a uniform film thickness of, for example, several hundreds Å.

Figure 2O:
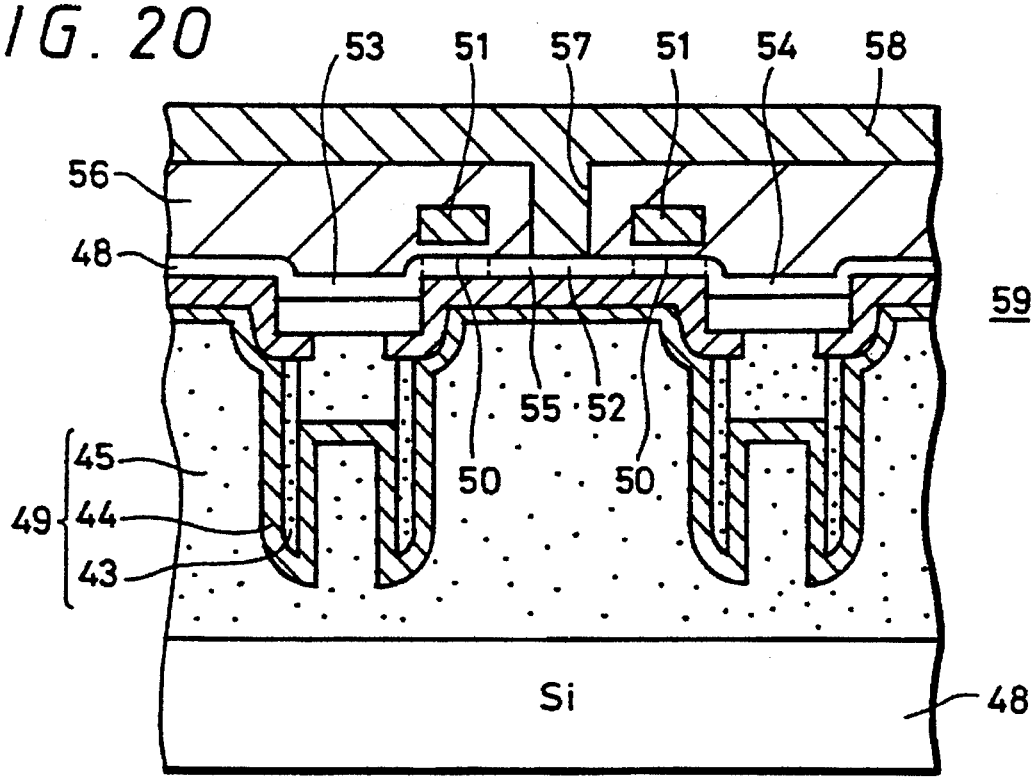

Next, as shown in FIG. 2O, after the thin silicon film 48 has been subjected to patterning process in the region where an MOS transistor is to be formed, a word line 51 constituting a gate electrode is formed on the top of the patterned thin silicon film 48 through a gate insulating film 50. Using the word line 51 as a mask, impurity is diffused in the silicon film 48 so that diffusion regions 52, 53, 54 constituting a source and a drain are formed in this thin silicon film 48 by self-alignment. Thus, a switching MOS transistor 55 is formed here.

The diffusion regions 53 and 54 are respectively connected to the capacitor electrode 43 of the capacitor 49 through the silicon portion 34A.

Then, after an insulating film 56 is formed, a contact hole 57 is formed therein, and a bit line 58 which is connected to the diffusion region 52 is formed.

In this way, a desired DRAM cell 59 is obtained which is constituted by the capacitor 49 for storing electric charges, and the switching MOS transistor 55 for controlling the transferring and drawing of electric charges to and from the capacitor 49.

According to the aforesaid manufacturing method of the embodiment, the convex portion 34 is formed on the silicon substrate 31, the insulating film 35 is formed on the surface of the silicon substrate and the convex portion, and the capacitor 49 is formed thereon, after which the support substrate 47 is affixed by lamination, the silicon substrate 31 is ground from the rear surface thereof, and the thin film 48 is formed on the insulating film 35 by lateral epitaxial growth process based on the remaining silicon portion 34A serving as the seed of the epitaxial growth. Consequently, in spite of warpage of the silicon wafer, thickness irregularities thereof, and grinding irregularities of the substrate, the thin silicon film 48 of a uniform film thickness can be formed.

Furthermore, since the depth a of the convex portion 34 of the silicon substrate 31 is made large enough to absorb grinding irregularities, and since the silicon portion 34A remaining after the grinding process is used as the seed of lateral epitaxial growth, it is not necessary to strictly control the film thickness of the silicon portion 34A, so that the yield of the grinding process for the silicon substrate 31 can be improved.

Accordingly, it is possible to manufacture a highly reliable DRAM with good yield.

The second embodiment of the present invention will de described with reference to FIGS. 3A to 3E.

Figure 3A:
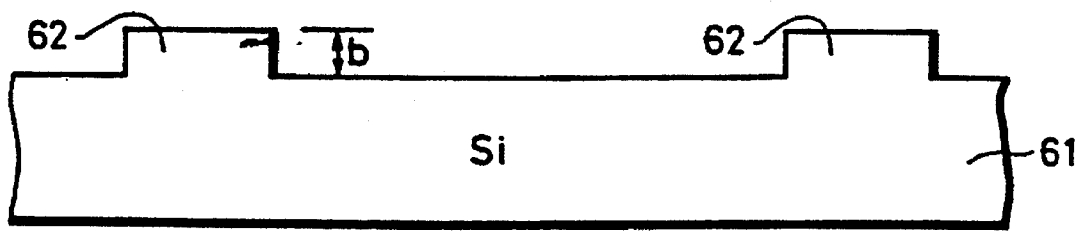

As shown in FIG. 3A, a convex portion 62 having a step portion with a depth b is formed by using the photo etching technique in the same manner as the first embodiment on a portion of a major surface of a silicon substrate 61 which portion does not correspond to a region where an element is to be formed later.

Figure 3B:
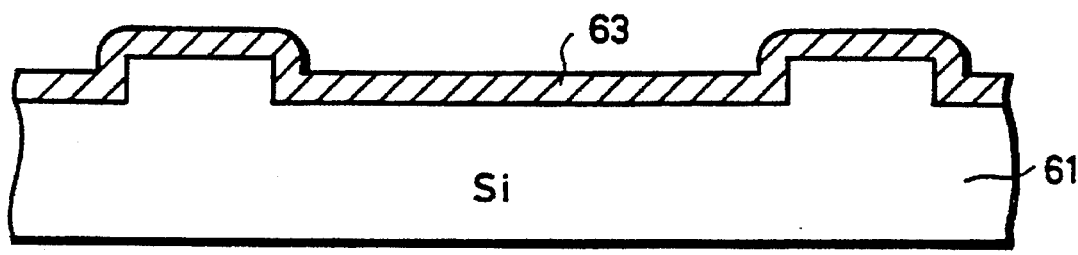

Next, as shown in FIG. 3B, an insulating film 63 made of such as SiO$_2$ or the like is formed by using, for example, CVD technique over the entire surface of the major surface of the substrate 61 including the convex portion 62.

Figure 3C:
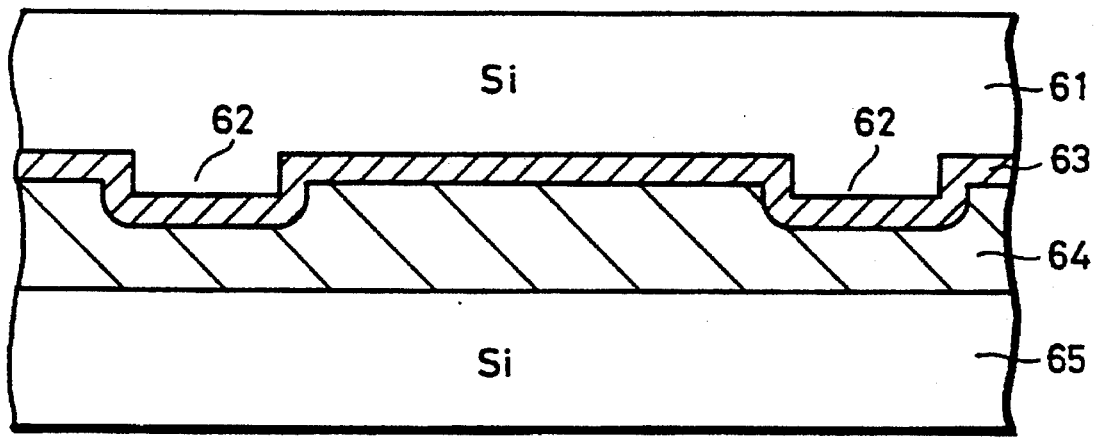

Then, as shown in FIG. 3C, another silicon substrate 65 constituting a support substrate is laminated through a flattening film 64 on the insulating film 63.

Next, as shown in FIG. 3D, the silicon substrate 61 is ground from the rear surface or the other major surface thereof to such a level that even if the substrate 61 is entirely eliminated while remaining only a portion 62A corresponding to the convex portion 62 to thereby expose the surface of the insulating film 63.

Next, as shown in FIG. 3E, a thin silicon film 66 is formed on the insulating film 63 by lateral epitaxial growth process based on the remaining silicon portion 62A serving as a seed of the lateral epitaxial growth. Thus, a so-called SOI substrate 67 is manufactured.

Thereafter, the thin silicon film 66 of this SOI substrate 67 is selectively removed by patterning process, or by another method, thereby forming a device isolation region. Then, a desired semiconductor element is formed in an element formation region 68 of the thin silicon film 66 on the top of the insulating film 63.

Also, according to the manufacturing method of this embodiment, since the thin silicon film 66 is formed on the insulating film 63 by lateral epitaxial growth process based on the silicon portion 62A remaining after the grinding process serving as the seed of the lateral epitaxial growth, it is possible to obtain the SOI substrate 67 having the thin silicon film 66 of a uniform film thickness regardless of warpage of the silicon wafer, thickness irregularities thereof, or grinding irregularities, so that it is possible to manufacture semiconductor devices of good yield based on the SOI substrate 67.

As set out above, according to the present invention, in the manufacturing method for a semiconductor device using the laminate SOI technology, a thin semiconductor film which is to be formed into semiconductor elements can be formed with a uniform film thickness regardless of warpage of the semiconductor wafer, thickness irregularities thereof, or grinding irregularities.

Accordingly, the yield of the grinding is improved, and it is possible to manufacture, with good yield, highly reliable semiconductor devices such as semiconductor memories even under conditions of a high degree of integration.

Having described the preferred embodiments of the invention with reference to the accompanying drawings, it is to be understood that the invention is not limited to those precise embodiments and that various changes and modifications thereof cold be effected by one skilled in the art without departing from the spirit or scope of the novel concepts of the invention as defined in the appended claims.

What is claimed is:

1. A semiconductor device, comprising:

a portion of a semiconductor material;

an insulating film on a first side of said portion;

a support substrate supporting said portion from a second side; and a thin semiconductor film on said insulating film and connected epitaxially to said portion by epitaxial growth so that said thin semiconductor film is a single crystal with said portion, wherein said thin semiconductor film is of a uniform film thickness.

2. A dynamic memory device, comprising:

a portion of a semiconductor material;

an insulating film on said portion;

a capacitor connected at a first side to said portion through an opening in said insulating film;

a support substrate at a second side of said capacitor;

a thin semiconductor film on said insulating film and epitaxially connected to said portion by epitaxial growth so that said thin semiconductor film is a single crystal with said portion, said portion serving as a seed for lateral epitaxial growth of said thin semiconductor film; and a transistor in said thin semiconductor film.

3. A dynamic memory device, comprising:

a portion of a semiconductor material;

an insulating film on said portion;

a capacitor connected at a first side to said portion through an opening in said insulating film;

a support substrate at a second side of said capacitor;

a thin semiconductor film on said insulating film and epitaxially connected to said portion by epitaxial growth so that said thin semiconductor film is a single crystal with said portion; and a transistor in said thin semiconductor film.

4. A dynamic memory device as claimed in claim 3, wherein said thin semiconductor film is of a uniform film thickness.

* * * * *